(12) United States Patent
Chen et al.

(10) Patent No.: US 12,381,538 B2
(45) Date of Patent: Aug. 5, 2025

(54) CALIBRATION METHOD AND TUNING METHOD FOR ON-CHIP DIFFERENTIAL ACTIVE RC FILTER

(71) Applicant: SOUTH CHINA UNIVERSITY OF TECHNOLOGY, Guangdong (CN)

(72) Inventors: Zhijian Chen, Guangdong (CN); Bin Li, Guangdong (CN); Guangyin Feng, Guangdong (CN); Shan Gao, Guangdong (CN); Zhaohui Wu, Guangdong (CN)

(73) Assignee: SOUTH CHINA UNIVERSITY OF TECHNOLOGY, Guangdong (CN)

( * ) Notice: Subject to any disclaimer, the term of this patent is extended or adjusted under 35 U.S.C. 154(b) by 0 days.

(21) Appl. No.: 18/559,562

(22) PCT Filed: Nov. 8, 2022

(86) PCT No.: PCT/CN2022/130627
§ 371 (c)(1),
(2) Date: Nov. 8, 2023

(87) PCT Pub. No.: WO2023/168971
PCT Pub. Date: Sep. 14, 2023

(65) Prior Publication Data
US 2024/0243731 A1    Jul. 18, 2024

(30) Foreign Application Priority Data

Mar. 11, 2022  (CN) .......................... 202210234624.4

(51) Int. Cl.
*H03H 11/04*  (2006.01)
*H03F 3/45*  (2006.01)
*H03H 11/12*  (2006.01)

(52) U.S. Cl.
CPC ..... *H03H 11/0472* (2013.01); *H03F 3/45475* (2013.01); *H03H 11/1204* (2013.01); *H03F 2200/261* (2013.01); *H03F 2200/375* (2013.01)

(58) Field of Classification Search
CPC ........... H03H 11/0472; H03H 11/1204; H03H 11/12; H03H 7/0161; H03H 7/0169;
(Continued)

(56) References Cited

U.S. PATENT DOCUMENTS

| 4,972,360 A | 11/1990 | Cukier et al. |
| 2011/0131439 A1 | 6/2011 | Renner et al. |
| 2014/0176233 A1* | 6/2014 | Chen ................. H03H 11/1252 327/554 |

FOREIGN PATENT DOCUMENTS

| CN | 1551501 | 12/2004 |
| CN | 101656519 | 2/2010 |

(Continued)

OTHER PUBLICATIONS

"International Search Report (Form PCT/ISA/210) of PCT/CN2022/130627", mailed on Jan. 18, 2023, with English translation thereof, pp. 1-6.
(Continued)

*Primary Examiner* — Jung Kim
(74) *Attorney, Agent, or Firm* — JCIPRNET

(57) ABSTRACT

A calibration method and a tuning method for an on-chip differential active RC filter are provided. The calibration method comprises: obtaining zero-crossing time of a differential signal outputted by a single-pole point real number filter by analyzing the single-pole point real number filter; setting a reference clock period according to the relationship between the zero-crossing time and the bandwidth of the single-pole point real number filter, and setting a calibration working time sequence according to the reference clock period; and scanning an RC configuration of an RC array
(Continued)

according to the calibration working time sequence to realize calibration of the RC array.

6 Claims, 8 Drawing Sheets

(58) Field of Classification Search
CPC .. H03H 7/0153; H03H 7/0138; H03H 7/0107; H03H 2210/00; H03H 2210/04; H03H 2210/043; H03H 2210/03; H03H 2210/033; H03H 2210/036; H03H 2210/021; H03H 2210/028; H03H 2210/01; H03H 2210/017; H03H 2210/015; H03H 2210/012; H03F 3/45475; H03F 2200/261; H03F 2200/375; Y02E 40/40
See application file for complete search history.

(56) References Cited

FOREIGN PATENT DOCUMENTS

| | | |
|---|---|---|
| CN | 102522994 | 6/2012 |
| CN | 108111146 | 6/2018 |
| CN | 108134592 | 6/2018 |
| CN | 110113028 | 8/2019 |
| CN | 113328754 | 8/2021 |
| CN | 113890506 | 1/2022 |
| CN | 114337600 | 4/2022 |
| JP | 2008017287 | 1/2008 |

OTHER PUBLICATIONS

Jinup Lim et al., "A wide-band active-RC filter with a fast tuning scheme for wireless communication receivers," IEEE 2005 Custom Integrated Circuits Conference, Sep. 2005, pp. 637-640.

Youngjoo Cho et al., "Fast on-chip tuning circuit for active RC filters using the SAR scheme," 48th Midwest Symposium on Circuits and Systems, 2005, Aug. 2005, pp. 1522-1525.

Xin Jin et al., "A 6th order zero capacitor spread 1MHz—10MHz tunable CMOS active-RC low pass filter with fast tuning scheme," 2012 IEEE International Symposium on Circuits and Systems (ISCAS), May 2012, pp. 1187-1190.

Yu-Chih Chen et al., "A 120-MHz active-RC filter with an agile frequency tuning scheme in 0.18-μm CMOS," 2008 IEEE International Symposium on VLSI Design, Automation and Test (VLSI-DAT), Apr. 2008, pp. 1-4.

Chaoxuan Zhang, "Filtering Technology of Programmable RF Transceiver," Master's thesis, Mar. 2018, China Aerospace Science and Technology Corporation.

* cited by examiner

CALIBRATION METHOD AND TUNING METHOD FOR ON-CHIP DIFFERENTIAL ACTIVE RC FILTER

CROSS-REFERENCE TO RELATED APPLICATION

This application is a 371 of international application of PCT application serial no. PCT/CN2022/130627, filed on Nov. 8, 2022, which claims the priority benefit of China application no. 202210234624.4, filed on Mar. 11, 2022. The entirety of each of the above-mentioned patent applications is hereby incorporated by reference herein and made a part of this specification.

BACKGROUND

Technical Field

The invention relates to an analog integrated circuit and in particular, relates to a calibration method and a tuning method for an on-chip differential active RC filter.

Description of Related Art

Active RC filters are used most of the time for baseband signal filtering in transceivers. In order to ensure signal quality and adaptability to various signal bandwidths, the bandwidth of a filter needs to be accurately adjustable. The resistors and capacitors on the chip will show considerable deviations due to changes in PVT, so the filter needs to be calibrated to ensure the accuracy of the bandwidth. Currently, the active RC filter calibration methods mainly include two methods: integral method and exponential method.

The idea of the integral method is to charge C with a current of $V_{ref}/R$, the charging time to $V_{ref}$ is compared to the reference clock period, and the RC configuration is modified according to the comparison result through successive approximation. The voltage on C is the integral of $V_{ref}/R$ over time. It is not difficult to figure out that the time for charging C to $V_{ref}$ is the time constant RC. As long as the reference clock frequency is set to the target bandwidth of the filter, the filter can be calibrated. References in this regard include [1], [2], [3], [4], and [5]. It is worth mentioning that the integral structure requires a voltage buffer because it uses $V_{ref}$ to generate a current.

The idea of the exponential method is to use RC to form a first-order low-pass filter and test its step response. Its step response is an exponential curve related to the filter time constant. Calibration may also be completed by comparing the time when the step response reaches a specific reference voltage to the reference clock period and modifying the RC configuration using the successive approximation method. References in this regard include [6], [7], and [8]. It is worth mentioning that this structure does not require a voltage buffer.

Herein, the references [1] to [8] are:

[1] Jinup L, Youngjoo C, Kyungsoo J, et al. A wide-band active-RC filter with a fast tuning scheme for wireless communication receivers[C]//IEEE Custom Integrated Circuits Conference. IEEE, 2005.

[2] Cho Y, Lim J, Jung K, et al. Fast on-chip tuning circuit for active RC filters using the SAR scheme[C]//Symposium on Circuits & Systems. IEEE Xplore, 2005:1522-1525 Vol. 2.

[3] Si Cuiying. Active filter RC time constant calibration circuit and method. CN108134592A[P], 2018.

[4] Fu Yongwen. Automatic calibration circuit for time constant of active filter. CN108111146A[P], 2018.

[5] Jin Gang, Huang Piao, Zhuang Yiqi et al. Voltage division integral type time constant calibration circuit of on-chip active RC filter.

[6] Xin J, Dai F F. A 6th order zero capacitor spread 1 MHz-10 MHz tunable CMOS active-RC low pass filter with fast tuning scheme[C]//IEEE International Symposium on Circuits & Systems. IEEE, 2012.

[7] Chen Y C, Chiu W H, Lin T H. A 120-MHz active-RC filter with an agile frequency tuning scheme in 0.18-μm CMOS[C]//IEEE International Symposium on Vlsi Design. IEEE, 2008.

[8] Zhang Chaoxuan. Filtering Technology of Programmable RF Transceiver [D]. China Aerospace Science and Technology Corporation.

In general, in the conventional methods, a set of RC arrays are set up separately for testing most of the time without multiplexing the RC arrays on the filter, resulting in a waste of area. Further, in the conventional methods, a circuit that generates a reference voltage is also needed, and a voltage buffer is also needed in the integral calibration method, so the circuit is more complicated.

SUMMARY

The technical problem to be solved by the invention is to provide a calibration method and a tuning method for an on-chip differential active RC filter in view of the shortcomings of the related art, in which a capacitor on the filter is multiplexed, so a capacitor array is not required to be additionally added, a reference voltage and a voltage buffer are not required, and the anti-interference capability is high.

The invention provides a calibration method for an on-chip differential active RC filter, and in the method, zero-crossing time of a differential signal outputted by a single-pole point real number filter is obtained by analyzing the single-pole point real number filter. A reference clock period is set according to a relationship between the zero-crossing time and a bandwidth of an RC filter, and a calibration working time sequence is set according to the reference clock period. An RC configuration of an RC array is scanned according to the calibration working time sequence to realize calibration of the RC array.

The scanning the RC configuration of the RC array according to the calibration working time sequence specifically includes the following.

In step one, a pulse generation unit connected to an input terminal of the single-pole point real number filter is arranged, the pulse generation unit outputs a pulse signal according to the calibration working time sequence, and an RC configuration is preset for the RC array.

In step two, a comparator samples the differential signal outputted by the single-pole point real number filter according to the pulse signal, and a comparison result is obtained.

In step three, a relationship between a current bandwidth and a target bandwidth of the single-pole point real number filter are determined according to the comparison result.

In step four, a next set of RC configuration is set in the RC array by using a successive approximation algorithm, step two and step three are repeated; until the operation of the successive approximation algorithm is finished, so that an RC configuration with a bandwidth closest to the target bandwidth is obtained, and the calibration of the RC array is completed.

A transfer function of the single-pole point real number filter is changed through the inverse Laplace transform, and a differential time domain response of the single-pole point real number filter with respect to a falling edge of a pulse input is obtained. The zero-crossing time is obtained when the differential time domain response at an output of the single-pole point real number filter is zero.

The zero-crossing time is:

$$tr = \ln(2)\tau,$$
$$\tau = \frac{1}{2\pi f_n},$$

wherein $\tau$ is the time constant, and $f_n$ is the bandwidth of the single-pole point real number filter.

The reference clock period is:

$$T = \ln(2)\frac{1}{2\pi f_{n1}},$$

wherein $f_{n1}$ is the target bandwidth of the single-pole point real number filter.

In step three:

If the comparator outputs a high level, then current zero-crossing time of the differential signal is ahead of the reference clock period, indicating that a bandwidth obtained through a current RC configuration is excessively large.

If the comparator outputs a low level, then the current zero-crossing time of the differential signal lags behind the reference clock period, indicating that the bandwidth obtained through the current RC configuration is excessively small.

A compensation unit is arranged according to an operational amplifier delay of an operational amplifier in the single-pole point real number filter, so that the comparator is delayed by the operational amplifier delay and then samples an output voltage of the single-pole point real number filter.

The compensation unit is an inverter chain.

An input terminal of the comparator is connected to a first switch group, a second switch group, and a sampling capacitor. The first switch group is connected to an output terminal of the single-pole point real number filter, and the second switch group is connected to the pulse generation unit.

The pulse generation unit is mainly formed by a resistive voltage divider structure and two switch groups with opposite phases.

In a tuning method for an on-chip differential active RC filter, the calibration method is applied to tune the RC array according to the target bandwidth of the single-pole point real number filter.

Beneficial Effects

The advantages of the invention include the following.

1. By analyzing the single-pole point real number filter and setting the calibration working sequence, the RC array on the filter can be multiplexed when the time constant is tested, and an RC array is not required to be additionally added, so the area occupied by the calibration circuit is reduced.

2. The calibration circuit structure adopts a fully differential circuit structure, which makes pulse generation and zero-crossing detection simple. The positive and negative poles of the output of the single-pole point real number filter are directly connected to the positive and negative input terminals of the comparator, so no reference voltage is required when the zero-crossing point of the filter output is detected. The zero-crossing point and the pulse input amplitude are irrelevant. Therefore, there is no need for a voltage buffer, only a simple resistor voltage divider is needed to generate a test pulse signal.

3. A sampling capacitor is added to the comparator input, and a reliable calibration working time sequence is designed. The output of the operational amplifier after one reference clock period can be more accurately sampled without being limited by the comparator speed, so the accuracy of the calibration is improved.

4. The error caused by the operational amplifier delay is compensated through the delay of the inverter chain, so high calibration accuracy is achieved.

DESCRIPTION OF THE EMBODIMENTS

The invention will be further described below in combination with the embodiments, and the embodiments do not constitute any limitation on the invention. A limited number of modifications made by anyone within the scope of the claims of the invention are still within the scope of the claims of the invention.

In a calibration method for an on-chip differential active RC filter provided by the invention, zero-crossing time of a differential signal $V_{out}$ outputted by a single-pole point real number filter is obtained by analyzing the single-pole point real number filter. A reference clock period is set according to a relationship between the zero-crossing time and a bandwidth of the single-pole point real number filter, and a calibration working time sequence is set according to the reference clock period. An RC configuration of an RC array is scanned according to the calibration working time sequence to realize calibration of the RC array.

A reference voltage is not required in the entire calibration process, so that the complexity of a calibration circuit is reduced. By setting the calibration working time sequence, the RC array on the filter may be multiplexed when a time constant is tested, and an RC array is not required to be additionally added, so an area occupied by the calibration circuit is reduced.

Figure 1:
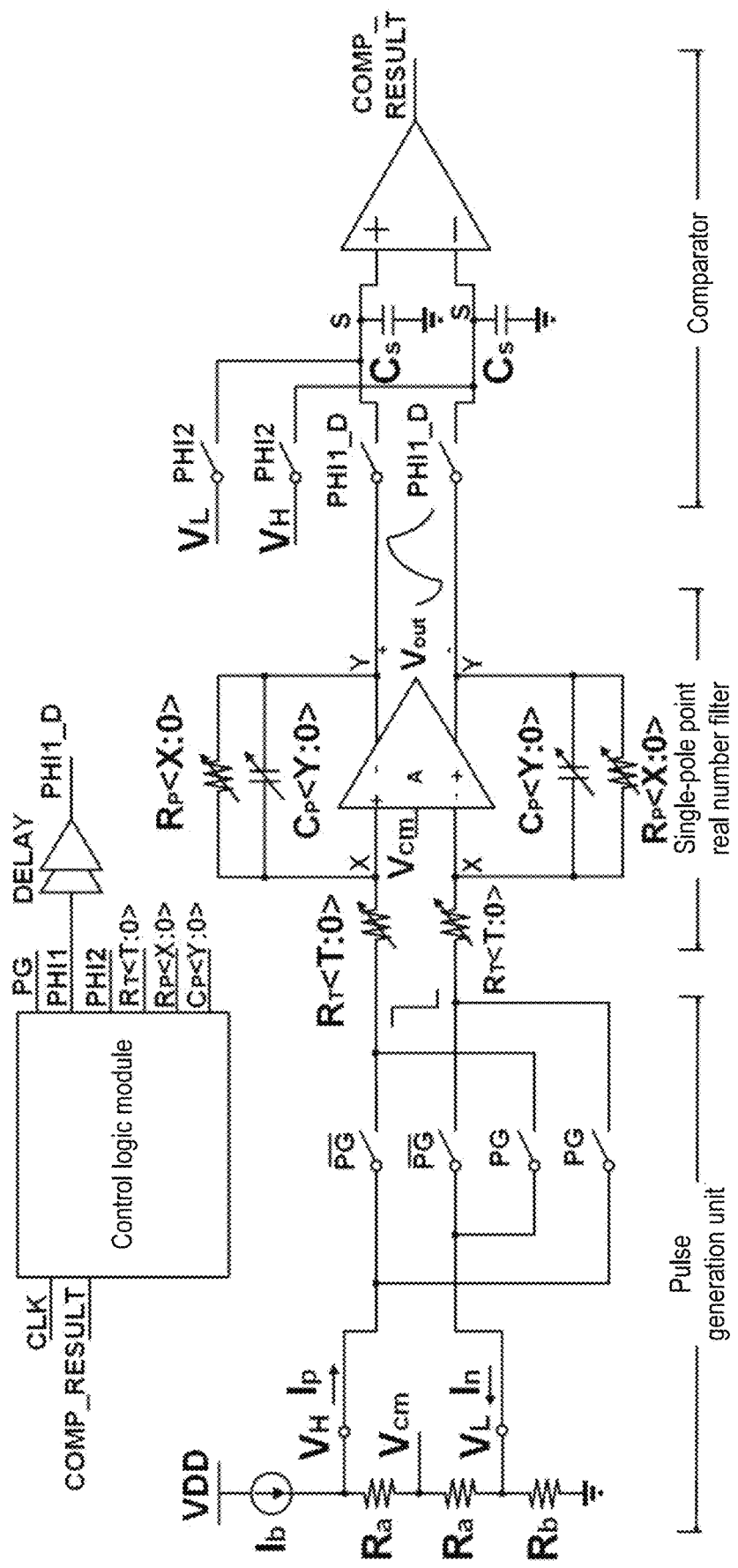
FIG. 1 is a schematic diagram of an overall structure of an active RC filter calibration circuit according to the invention.

AS shown in FIG. 1, this figure is a schematic diagram of a structure of an active RC filter calibration circuit according to the embodiment.

In FIG. 1, a pulse generation unit generates a pulse input required to test a time constant 1.

A single-pole point real number filter is the basic module that constitutes a higher-order active RC filter. A single-pole point real number filter is mainly formed by an operational amplifier and an RC array. During the calibration of the RC array, the RC array may be isolated by simply disconnecting the single-pole point real number filter from other parts in the active RC filter. Therefore, during calibration, there is no need to separately set up a set of RC configuration of the RC array for testing. The RC array on the active RC filter may be multiplexed, and an RC array does not need to be additionally added, so the purpose of reducing the area of the active RC filter is achieved.

A comparator is used to sample a response of the single-pole point real number filter to a pulse input and detect a relationship between current zero-crossing time and a reference clock period. A comparison result of the comparator is fed back to a control logic module, and the control logic module determines a next set of RC array control words $R_T<T:0>$, $R_P<X:0>$, $C_P<Y:0>$ based on a sampling result.

The theoretical derivation of the zero-crossing time in this embodiment is as follows.

Assuming that the operational amplifier in the single-pole point real number filter is an ideal operational amplifier, and a transfer function of the single-pole point real number filter is as follows:

$$H(s) = -\frac{R_P}{R_T} \frac{1}{1+sR_PC_P}.$$

Assuming that a pulse amplitude inputted to an input terminal of the operational amplifier is $V_a = V_H - V_L$. Regardless of a delay caused by the operational amplifier, the transfer function of the single-pole point real number filter is changed through the inverse Laplace transform, and a differential time domain response of the single-pole point real number filter with respect to a falling edge of the pulse input is obtained. The differential time domain response is expressed as:

$$V_{out}(t) = V_a \times \frac{R_P}{R_T}\left(1+(-1-1)e^{\frac{t}{\tau}}\right) = V_a \times \frac{R_P}{R_T}\left(1-2e^{\frac{t}{\tau}}\right).$$

Let the differential signal $V_{out}$ outputted by the single-pole point real number filter be equal to 0, and the time required for a differential signal $V_{out}$ waveform to rise to a zero-crossing point may be obtained, that is, the zero-crossing time is:

$$tr = \ln(2)\tau,$$

$$\tau = \frac{1}{2\pi f_n},$$

where $\tau$ is the time constant, $\tau = R_PC_P$, and $f_n$ is the bandwidth of the single-pole point real number filter. Different $\tau$ corresponds to different bandwidths of the single-pole point real number filter.

The reference clock period of this embodiment is:

$$T = \ln(2)\frac{1}{2\pi f_{n1}},$$

wherein $f_{n1}$ is a target bandwidth of the single-pole point real number filter. That is, $f_{n1}$ is the desired bandwidth of the single-pole point real number filter.

Figure 2:
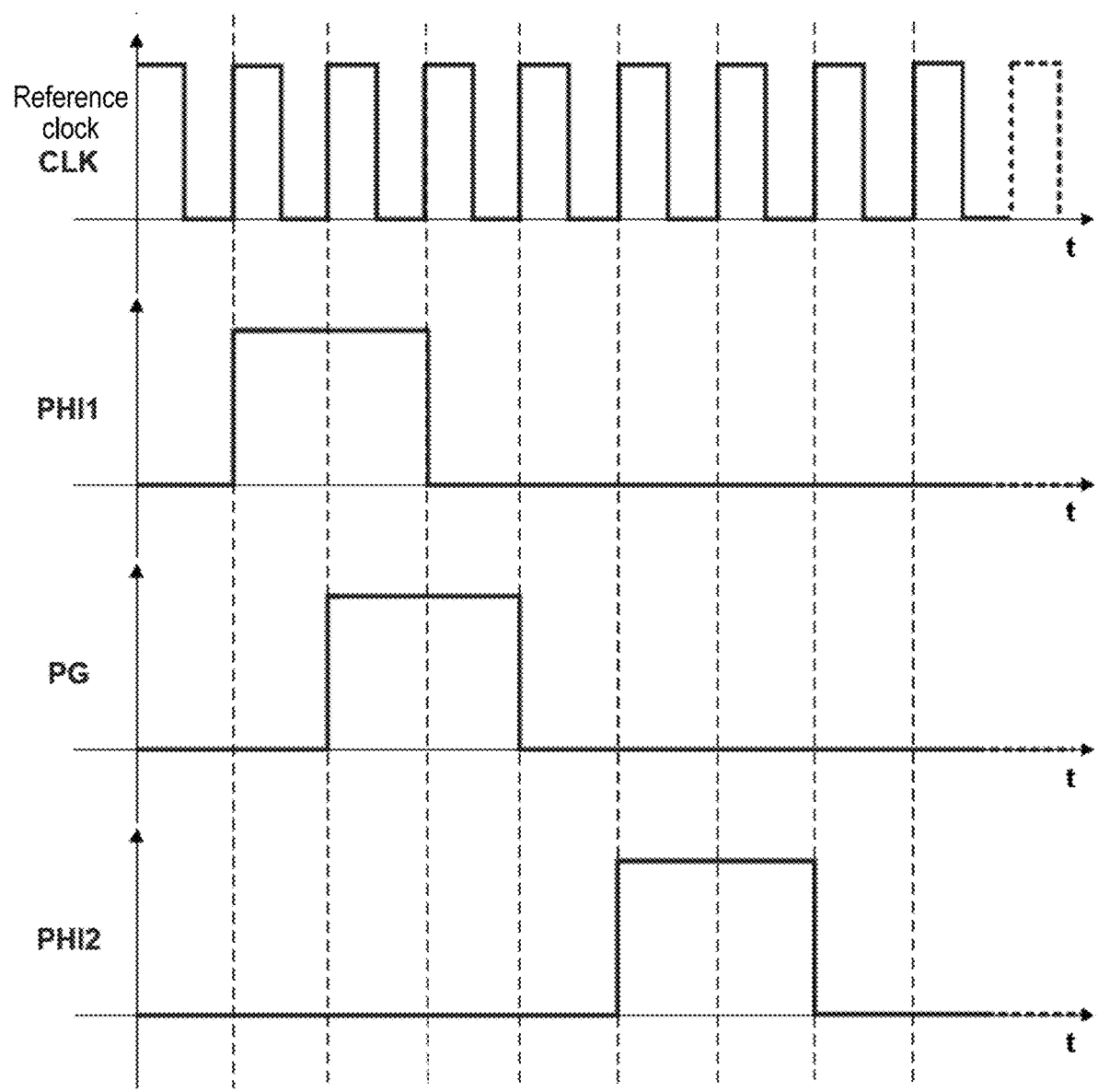
FIG. 2 is a waveform graph of a calibration working time sequence according to the invention.

In order to compare a difference between the time when the differential signal $V_{out}$ outputted by the operational amplifier rises to the zero-crossing point and the reference clock period during actual operation, the calibration working time sequence as shown in FIG. 2 is set in the invention according to the reference clock period.

The scanning of the RC configuration of the RC array according to the calibration working time sequence specifically includes the following.

In step one, a pulse generation unit connected to an input terminal of the single-pole point real number filter is arranged, the pulse generation unit outputs a pulse signal according to the calibration working time sequence, and an RC configuration is preset for the RC array.

In step two, when a reference clock period is inputted into the pulse signal, the comparator samples the differential signal outputted by the single-pole point real number filter, and a comparison result is obtained.

In step three, a relationship between a current bandwidth and a target bandwidth of the single-pole point real number filter is determined according to the comparison result.

In this step:

If the comparator outputs a high level, then the current zero-crossing time of the differential signal $V_{out}$ is ahead of the reference clock period, that is tr<T, indicating that a bandwidth obtained through a current RC configuration is excessively large.

If the comparator outputs a low level, then the current zero-crossing time of the differential signal $V_{out}$ lags behind the reference clock period, that is, tr>T, indicating that the bandwidth obtained through the current RC configuration is excessively small.

In step four, a next set of RC configuration is set in the RC array by using a successive approximation algorithm, step two and step three are repeated; until the operation of the successive approximation algorithm is finished, so that an RC configuration with a bandwidth closest to the target bandwidth is thus obtained, and the calibration of the RC array is completed.

The single-pole point real number filter of this embodiment provides the pulse signal through the pulse generation unit. The pulse generation unit outputs the pulse signal according to the calibration working time sequence, and the pulse signal is the pulse input required by the single-pole point real number filter.

The pulse generation unit of this embodiment is mainly formed by a resistive voltage divider structure and two switch groups with opposite phases. To be specific, the resistive voltage divider structure mainly is formed by two resistors $R_a$ and one resistor $R_b$. These three resistors are connected in series between a power terminal and a ground terminal. Herein, one of the resistors $R_a$ is connected to the power terminal, and a connection terminal thereof is a first direct current (DC) signal terminal, which outputs a DC signal $V_H$. One terminal that the two resistors $R_a$ are connected with each other is a common-mode reference voltage terminal, configured to output a common-mode reference voltage $V_{cm}$. The other terminal of the other resistor $R_a$ is connected to one terminal of the resistor $R_b$, and its connection terminal acts as a second DC signal terminal to output a DC signal $V_L$. The other terminal of the resistor $R_b$ is connected to ground.

That is, the resistive voltage divider structure uses resistive voltage division to generate three output voltages. The common-mode voltages outputted and inputted by the single-pole point real number filter are the same, both are the common-mode reference voltages $V_{cm}$. Therefore, considering the virtual short characteristics of the operational amplifier, the voltage at point X in FIG. 1 is also the outputted common-mode reference voltage $V_{cm}$. Therefore, the current $I_p$ in FIG. 1 is:

$$I_P = \frac{V_H - V_{cm}}{R_T}.$$

The current $I_n$ is:

$$I_n = \frac{V_{cm} - V_L}{R_T}.$$

Moreover, since $V_{cm}=(V_H+V_L)/2$, $I_p=I_n$, that is, the current flowing through the resistor $R_b$ is still the input current $I_b$ of the power terminal, that is:

$$V_a = V_H - V_L = 2*(I_b - I_p)*R_a,$$

$$V_{cm} = I_b*R_b + (I_b - I_p)*R_a.$$

From the above expression, a decrease in a resistor $R_1$ may cause the pulse amplitude $V_a$ and the common-mode reference voltage $V_{cm}$ to reduce. However, the pulse amplitude $V_a$ does not affect the rising of the output of the single-pole point real number filter to the zero-crossing time. However, if the common-mode reference voltage $V_{cm}$ drops too much, the single-pole point real number filter may not work. Therefore, in order to ensure that an electrical signal provided by the pulse generation unit can make the single-pole point real number filter work effectively and reliably, a resistance value of the resistor $R_1$ may be set to be much larger than that of the resistors $R_a$, so that the pulse amplitude $V_a$ and the common-mode reference voltage $V_{cm}$ may not be significantly affected.

Preferably, a relationship between the resistor $R_a$ and the resistor $R_1$ in the invention is set to: $R_a<R_T/10$.

The two groups of switch groups with opposite phases include a third switch group and a fourth switch group whose switching state is opposite to that of the third switch group. That is, the high level of a differential pulse outputted by these two switch groups is $V_H-V_L$, and the low level is $V_L-V_H$. The amplitudes of high and low levels are symmetrical. The third switch group is controlled by a control signal PG, and the fourth switch group is controlled by a control signal PG. The pulse signal is generated through these two switch groups, and its structure is simple and easy to be implemented.

An input terminal of the comparator is connected to a first switch group, a second switch group, and a sampling capacitor $C_S$. The first switch group is connected to an output terminal of the single-pole point real number filter, and the second switch group is connected to the pulse generation unit. The first switch group inputs the differential signal $V_{out}$ outputted by the single-pole point real number filter into the comparator for comparison according to the calibration working time sequence, obtains a comparison result of the positive and negative terminals of the comparator, and thus obtains a zero-crossing relationship based on the comparison result. In this embodiment, the first switch group is controlled by a control signal PHI1 outputted by the control logic module in FIG. 1, and the second switch group is controlled by a control signal PHI2 outputted by the control logic module in FIG. 1. When the differential signal $V_{out}$ outputted by the single-pole point real number filter is sampled, the first switch group is turned on, and the voltage on the sampling capacitor $C_S$ is the differential signal $V_{out}$ outputted by the single-pole point real number filter. When the first switch group is turned off, sampling is completed, and the sampling capacitor $C_S$ maintains the input of the comparator to the voltage before the switch is turned off. During reset, the second switch group is turned on, the voltage on the sampling capacitor $C_S$ is set to the DC signal $V_L$ and the DC signal $V_H$ outputted by the pulse generation unit, and the comparator completes the reset.

It can be seen from FIG. 2 that the calibration working time sequence of this embodiment mainly includes the control signal PG and the control signals PHI1 and PHI2. Herein, the control signal PHI1 leads the control signal PG by one reference clock period, the control signal PHI2 lags behind the control signal PG by three reference clock periods, and the high levels of the control signals PG, PHI1, and PHI2 are equal to two reference clock periods.

During the calibration process, when the control signal PHI1 is high level, the signal inputted by the comparator is the differential signal $V_{out}$ outputted by the operational amplifier. Further, the differential signal $V_{out}$ charges the sampling capacitor $C_S$. When $V_{out}>0$, the comparator outputs high level, otherwise it outputs low level. When the control signal PHI1 is low level, the connection between the comparator and the operational amplifier is disconnected. At this time, the input of the comparator is the voltage $V_S=V_{out}$ held on the sampling capacitor $C_S$ before the disconnection. If $V_S>0$, the output of the comparator is still high level. Therefore, the purpose of the arrangement of the sampling capacitor $C_S$ is to more accurately sample the differential signal $V_{out}$ after one reference clock period without being limited by the speed of the comparator in this embodiment.

Figure 3:
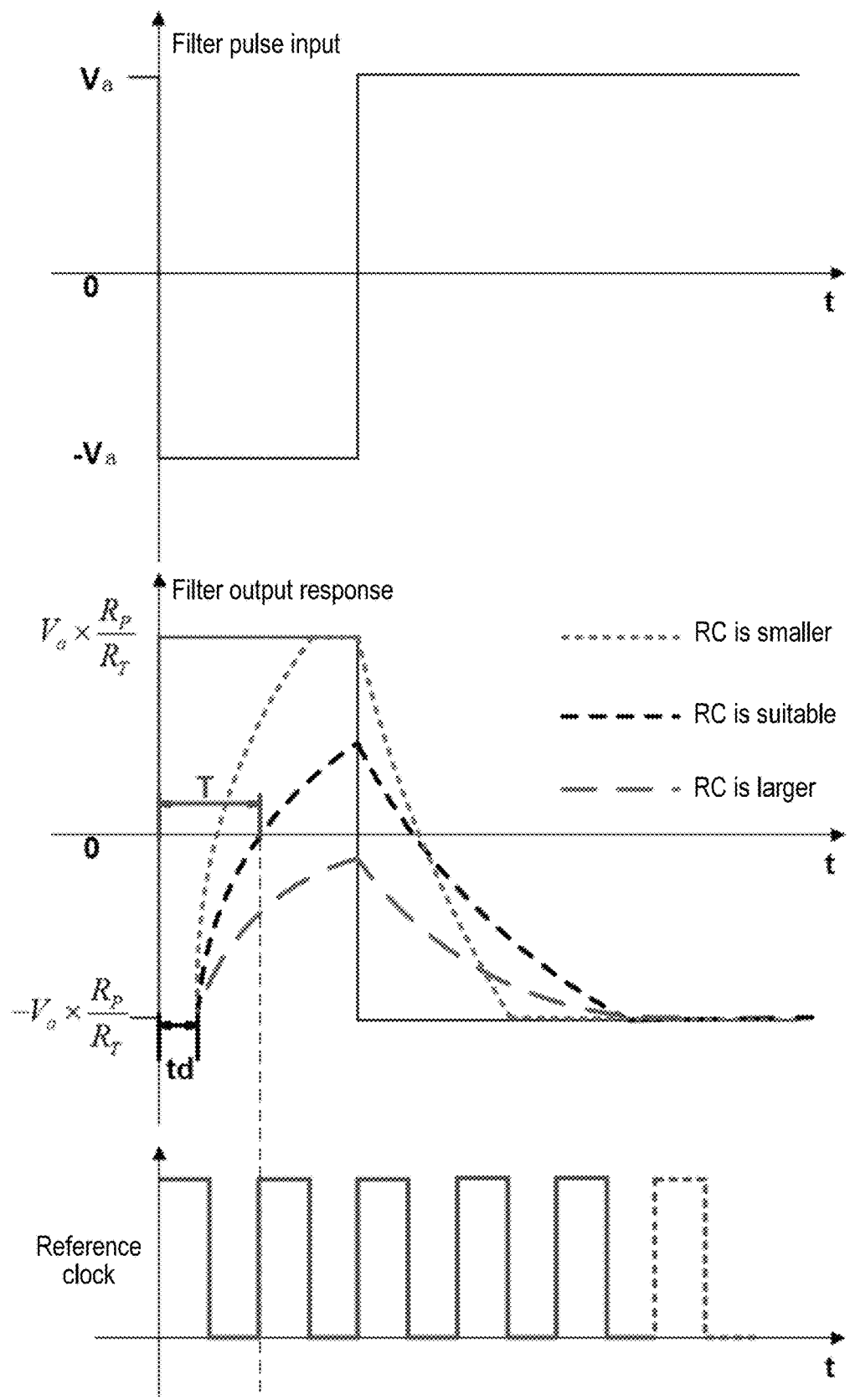
FIG. 3 is a waveform graph of an output performed by a single-pole point real number filter during calibration according to the invention.

As shown in FIG. 2, when the control signal PHI1 is high level, the comparator samples the differential signal $V_{out}$. One clock period after the rising edge of the control signal PHI1 arrives, the rising edge of the control signal PG arrives, and the differential signal $V_{out}$ begins to rise. One clock period after the rising edge of the control signal PG arrives, the control signal PHI1 becomes low level, and the sampling of the output of the single-pole point real number filter is completed. The voltage on the sampling capacitor $C_S$ remains the output voltage of the single-pole point real number filter at this moment. As shown in FIG. 3, if the voltage $V_S$ of the sampling capacitor $C_S>0$, it means that the zero-crossing time of the differential signal $V_{out}$ is ahead of the reference clock period. The zero-crossing time is advanced, indicating that the RC configuration value of the RC array is excessively small, and the RC value shall be increased. If $V_S<0$, it means that the zero-crossing time of the differential signal $V_{out}$ lags behind the reference clock period. The zero-crossing lag indicates that the RC configuration value of the RC array is excessively large, and the RC value shall be reduced. Two clock periods after the rising edge of the control signal PG, the control signal PG becomes low level, and the differential signal $V_{out}$ outputted by the single-pole point real number filter begins to decrease and eventually returns to the lowest voltage. One clock period after the falling edge of the control signal PG arrives, the high level of the control signal PHI2 remains high for two clock periods and then changes to the low level after the rising edge arrives. The voltages on the two sampling capacitors $C_S$ of the comparator are set to $V_L$ and $V_H$, and the comparator is reset.

In order to ensure that the output of the single-pole point real number filter returns to the lowest voltage before the next comparison, the calibration working time sequence is repeated with 16 reference clock periods in this embodiment.

After obtaining the relationship between the zero-crossing point and the reference clock period, the calibration circuit calibrates the RC array based on this relationship. To be specific, the control logic module uses the successive approximation algorithm to scan the RC array based on each comparison result to complete the calibration.

Preferably, a compensation unit is arranged according to an operational amplifier delay td of the operational amplifier in the single-pole point real number filter, so that the comparator is delayed by the operational amplifier delay td and then samples the output voltage of the single-pole point real number filter, so that the calibration accuracy is effectively improved.

To be specific, the compensation unit is an inverter chain. The inverter chain is formed by a plurality of inverters connected in series.

Due to the limited bandwidth of the operational amplifier, a delay occurs as the signal passes through the operational amplifier. The following analyzes the impact of the operational amplifier delay td on calibration to illustrate the feasibility of using an inverter chain to compensate for the delay.

In the calibration circuit of the active RC filter, let $R_p=R_7=R$ and $C_p=C$, and the analytical formula $A_0/(1+s/\omega_0)$ is used to model the operational amplifier, where $A_0$ is the low-frequency gain, and co is the main pole. A transfer function of the single-pole point real number filter after considering the bandwidth of the operational amplifier is:

$$H(s) = \frac{-A_0 \omega_0}{RCs^2 + (RC\omega_0 + A_0\omega_0 RC + 2)s + (A_0 + 2)\omega_0}.$$

Assuming that the two poles of the transfer function H(s) are far apart, $\omega_{p1} \ll \omega_{p2}$, then:

$$\omega_{p1} \approx \frac{1}{RC},$$

$$\omega_{p2} \approx (A_0 + 2)\omega_0 \approx A_0\omega_0.$$

The pole $\omega_{p2}$ introduced by the operational amplifier may delay the output waveform of the single-pole point real number filter. This will make the calibrated single-pole point real number filter have a larger bandwidth. As $\omega_{p2}$ increases, the impact becomes smaller.

Normalizing the time unit to the ideal filter time constant τ, the step response of the filter using an ideal operational amplifier is:

$$V_{ideal} = 1 - 2e^t.$$

Assuming $\omega_{p2}=K\omega_{p1}$, the step response of the filter using a non-ideal operational amplifier is:

$$V_{non-ideal} = \frac{2}{K-1}e^{-Kt} - \frac{2K}{K-1}e^{-t} + 1,$$

where K is the operation factor.

Figure 4:
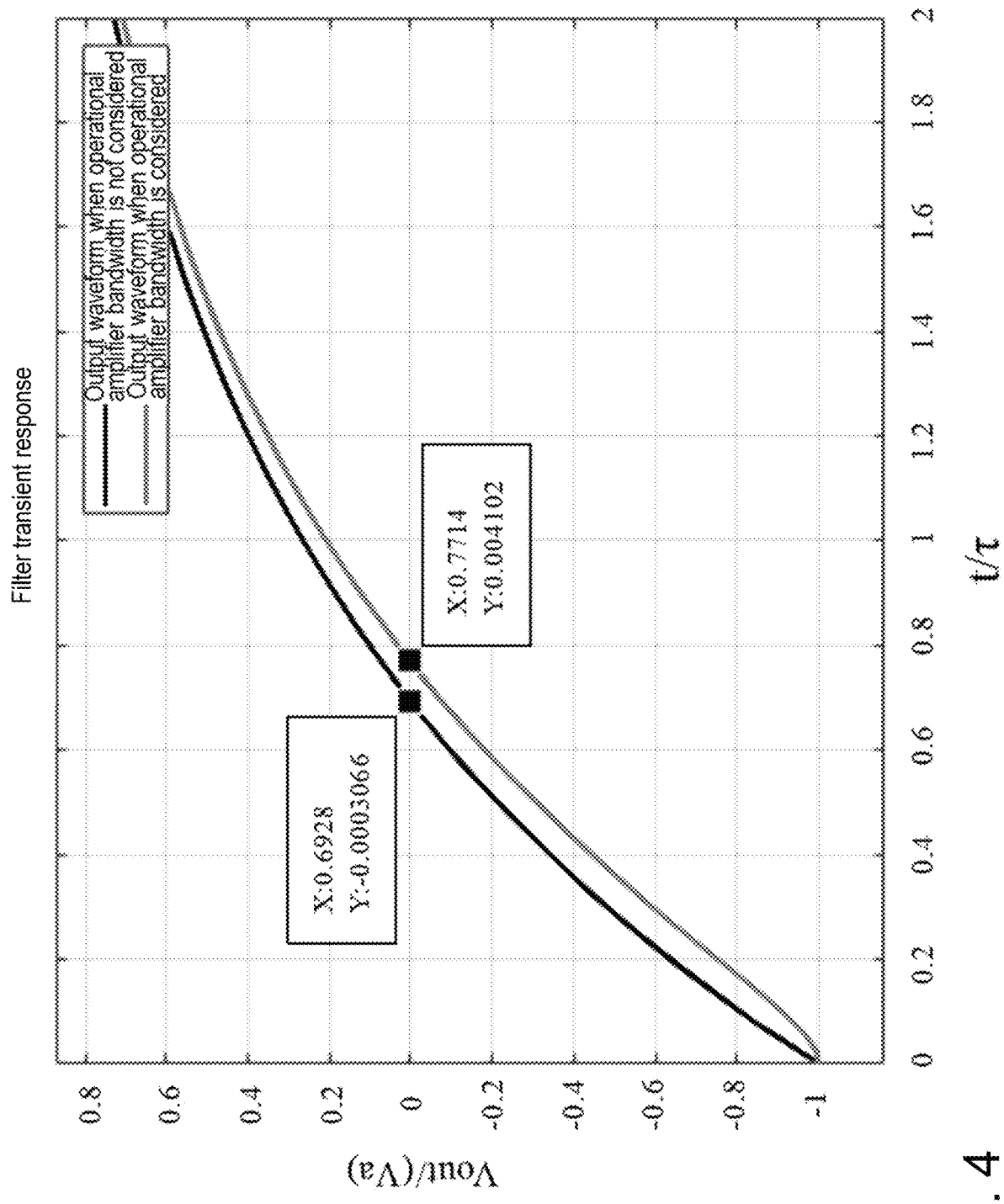
FIG. 4 is a schematic graph of calibration waveforms affected by a bandwidth of an operational amplifier according to the invention.

FIG. 4 shows the transient waveform graph when K=14 drawn through MATLAB.

Figure 5:
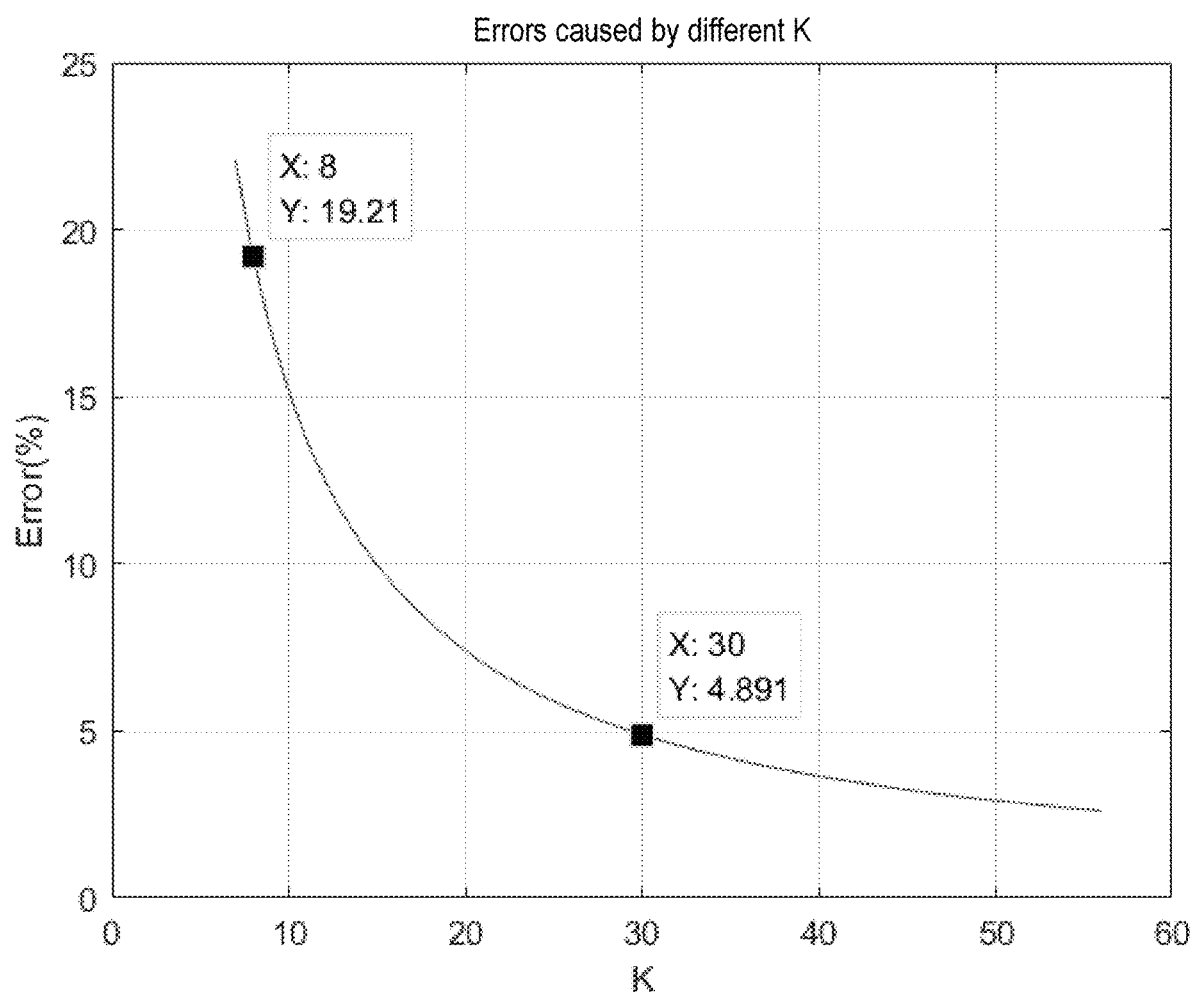
FIG. 5 is a schematic graph of errors caused by the operational amplifier at different K values according to the invention.

FIG. 5 shows the error of K at some values calculated through MATLAB.

Herein, the error value is:

$$\text{Error} = \frac{t @ (V_{non-ideal} = 0) - t @ (V_{ideal} = 0)}{t @ (V_{ideal} = 0)} \times 100\%.$$

Then the delay of the non-ideal zero-crossing point relative to the ideal zero-crossing point is:

$$\delta t = t @ (V_{non-ideal} = 0) - t @ (V_{ideal} = 0).$$

The above times are normalized to the time constant r of an ideal single-pole point real number filter, but operational amplifier delays at various bandwidths cannot be directly compared. Therefore, we try to convert it to a general time scale, as shown in the following formula:

$$\Delta t = \tau \delta t = \frac{1}{\omega_{p1}} \delta t = \frac{K}{\omega_{p2}} \delta t = K\delta t \left(\frac{1}{\omega_{p2}}\right).$$

Figure 6:
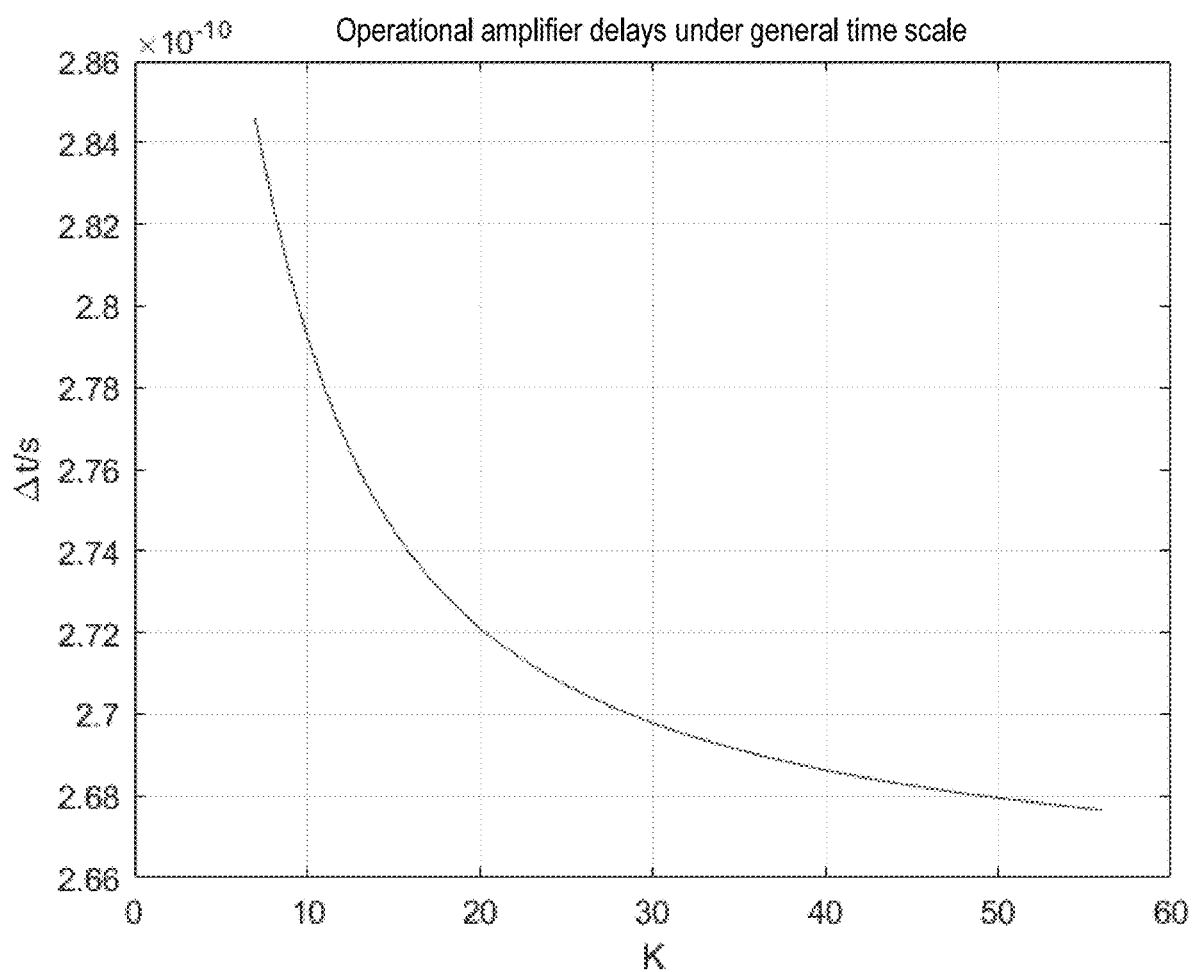
FIG. 6 is a schematic graph of operational amplifier delays of the operational amplifier under a general time scale according to the invention.

If $\omega_{p2}$ is set to $2\pi \times 600$ MHz, the operational amplifier delays at different K are shown in FIG. 6.

The above analysis shows that when K is small, the error caused by the operational amplifier delay td is considerably large. However, FIG. 6 shows that the actual delays at different K are not much different, so it can be cancelled by a fixed delay. As shown in FIG. 1, the control signal PHI1 is delayed using the inverter chain to compensate for the error caused by the operational amplifier delay td in the invention. The delayed signal of the control signal PHI1 is PHI1_D. After actual testing, this method shows favorable accuracy.

Figure 7:
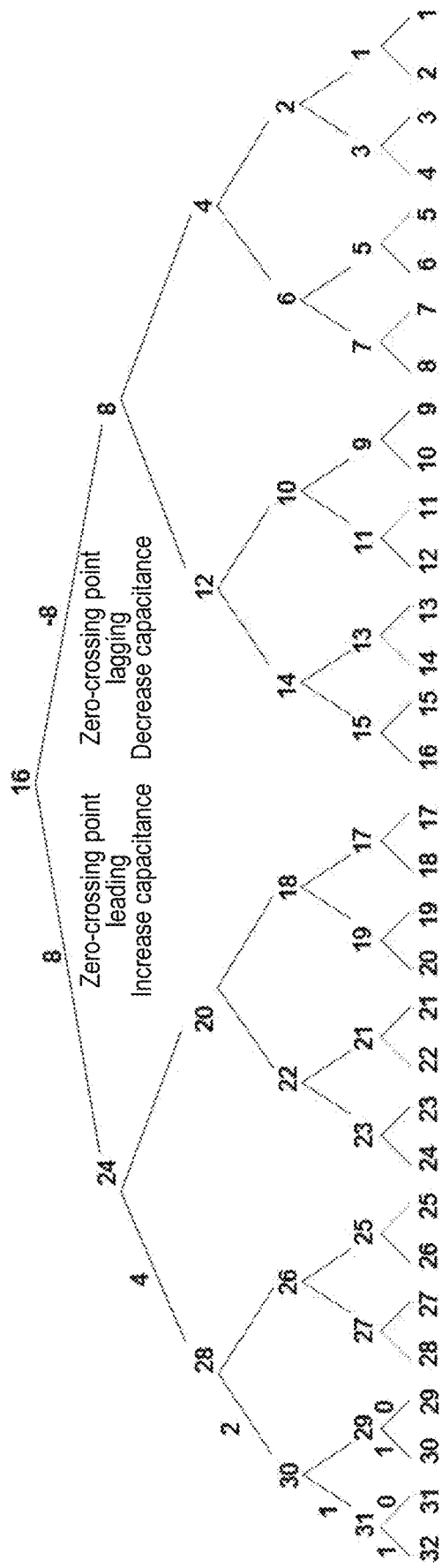
FIG. 7 is a schematic diagram of capacitor array successive approximation.

Regarding the successive approximation algorithm, it is explained through the schematic diagram shown in FIG. 7 in this embodiment. In FIG. 7, a capacitor array with 32 unit capacitors connected in parallel is taken as an example to show how to achieve successive approximation calibration of capacitance. The same principle applies to the successive approximation algorithm for more complex RC arrays.

Figure 8:
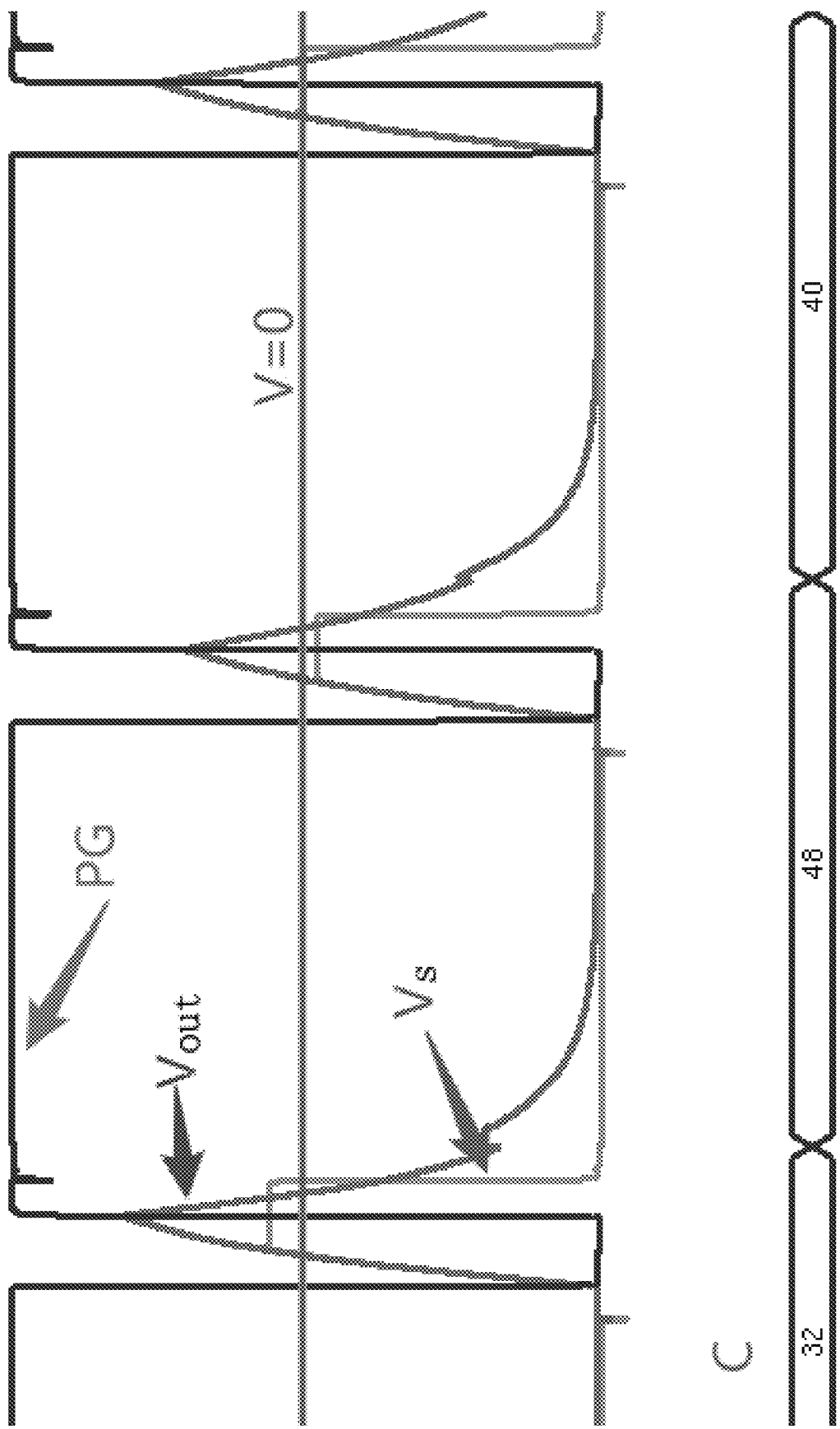
FIG. 8 is a waveform diagram simulating the capacitor array successive approximation.

FIG. 8 is a waveform diagram simulating the calibration circuit of FIG. 1. In FIG. 8, C at the bottom of the figure is the number of unit capacitors connected in parallel.

In a tuning method for an on-chip differential active RC filter, the calibration method is applied to tune the RC array according to the target bandwidth of the single-pole point real number filter, and this method is simple and effective.

The above are only preferred embodiments of the invention. It should be pointed out that for a person having ordinary skill in the art, some modifications and improvements may be made without departing from the structure of the invention, which will not affect the effect of the invention and the practicability of the patent.

What is claimed is:

1. A calibration method for an on-chip differential active RC filter, comprising:
obtaining a zero-crossing time of a differential signal outputted by a single-pole point real number filter by analyzing the single-pole point real number filter;
setting a reference clock period according to a relationship between the zero-crossing time and a bandwidth of the single-pole point real number filter, and setting a calibration working time sequence according to the reference clock period; and
scanning an RC configuration of an RC array according to the calibration working time sequence to realize calibration of the RC array,
wherein scanning the RC configuration of the RC array according to the calibration working time sequence comprises:
step one: arranging a pulse generation unit connected to an input terminal of the single-pole point real number filter, outputting a pulse signal by the pulse generation unit according to the calibration working time sequence, and presetting an RC configuration for the RC array;
step two: sampling, through a comparator, the differential signal outputted by the single-pole point real number filter according to the pulse signal, and obtaining a comparison result;
step three: determining a size relationship between a current bandwidth of the single-pole point real number filter and a target bandwidth of the single-pole point real number filter according to the comparison result; and
step four: setting a next set of RC configuration in the RC array by using a successive approximation algorithm, repeating step two and step three; until an operation of the successive approximation algorithm is finished, so that an RC configuration with a bandwidth closest to the target bandwidth is obtained, and completing the calibration of the RC array,
wherein a compensation unit is arranged according to an operational amplifier delay of an operational amplifier in the single-pole point real number filter, so that the comparator is delayed based on the operational amplifier delay and then the comparator samples the differential signal of the single-pole point real number filter,
wherein the compensation unit is an inverter chain configured to perform a fixed delay on a comparator sampling control signal to cancel the operational amplifier delay,
wherein the pulse generation unit is composed of a resistive voltage divider structure and two switch groups with opposite phases,
wherein the resistive voltage divider structure is composed of two resistors $R_a$ and one resistor $R_b$, one terminal of one of the two resistors $R_a$ acts as a power terminal of the resistive voltage divider structure, and one terminal of the resistor $R_b$ acts as a ground terminal of the resistive voltage divider structure, the two resistors $R_a$ and the one resistor $R_b$ are sequentially connected in series between the power terminal and the ground terminal, the power terminal also acts as a first direct current (DC) signal terminal, one terminal that the two resistors $R_a$ are connected with each other is a common-mode reference voltage terminal, and one terminal that one of the two resistors $R_a$ connected to the resistor $R_b$ acts as a second DC signal terminal,
wherein the two switch groups are composed of a third switch group and a fourth switch group whose switching state is opposite to that of the third switch group; the third switch group is composed of a first switch and a second switch, and two terminals of the first switch are respectively connected to the first DC signal terminal and a first input terminal of the single-pole point real number filter in one-to-one manner; two terminals of the second switch are respectively connected to the second DC signal terminal and a second input terminal of the single-pole point real number filter in one-to-one manner; the fourth switch group is composed of a third switch and a fourth switch, and two terminals of the third switch are respectively connected to the first DC signal terminal and the second input terminal of the single-pole point real number filter in one-to-one manner, two terminals of the fourth switch are respectively connected to the second DC signal terminal and the first input terminal of the single-pole point real number filter in one-to-one manner.

2. The calibration method for the on-chip differential active RC filter according to claim 1, further comprising:
changing a transfer function of the single-pole point real number filter through an inverse Laplace transform, obtaining a differential time domain response of the single-pole point real number filter with respect to a falling edge of a pulse input; and
obtaining the zero-crossing time according to that the differential time domain response at an output of the single-pole point real number filter is zero,
wherein the zero-crossing time is:

$$tr = \ln(2)\tau,$$

wherein $\tau$ is a time constant, $$\tau = \frac{1}{2\pi f_n},$$

and $f_n$ is the bandwidth of the single-pole point real number filter.

3. The calibration method for the on-chip differential active RC filter according to claim 2, wherein the reference clock period is:

$$T = \ln(2)\frac{1}{2\pi f_{n1}},$$

wherein $f_{n1}$ is the target bandwidth of the single-pole point real number filter.

4. The calibration method for the on-chip differential active RC filter according to claim 1, wherein in step three:
if the comparator outputs a high level, a current zero-crossing time of the differential signal is ahead of the reference clock period, indicating that a bandwidth obtained through a current RC configuration is excessively large; and if the comparator outputs a low level, the current zero-crossing time of the differential signal lags behind the reference clock period, indicating that the bandwidth obtained through the current RC configuration is excessively small.

5. The calibration method for the on-chip differential active RC filter according to claim 1, wherein an input terminal of the comparator is connected to a first switch group, a second switch group, and a sampling capacitor; wherein the first switch group is connected to an output terminal of the single-pole point real number filter, and the second switch group is connected to the pulse generation unit.

6. A tuning method for an on-chip differential active RC filter, wherein:
   according to a target bandwidth of a single-pole point real number filter, using the calibration method according to claim 1 to tune an RC array.

* * * * *